(12) United States Patent
Vanderberg et al.

(10) Patent No.: US 9,711,329 B2
(45) Date of Patent: Jul. 18, 2017

(54) SYSTEM AND METHOD TO IMPROVE PRODUCTIVITY OF HYBRID SCAN ION BEAM IMPLANTERS

(71) Applicant: Axcelis Technologies, Inc., Beverly, MA (US)

(72) Inventors: Bo H. Vanderberg, Gloucester, MA (US); Andy M. Ray, Newburyport, MA (US)

(73) Assignee: Axelis Technologies, Inc., Beverly, MA (US)

( * ) Notice: Subject to any disclaimer, the term of this patent is extended or adjusted under 35 U.S.C. 154(b) by 0 days.

(21) Appl. No.: 14/979,663

(22) Filed: Dec. 28, 2015

(65) Prior Publication Data

US 2016/0189928 A1  Jun. 30, 2016

Related U.S. Application Data

(60) Provisional application No. 62/096,976, filed on Dec. 26, 2014.

(51) Int. Cl.
*G21K 5/04* (2006.01)
*H01J 37/304* (2006.01)
*H01J 37/30* (2006.01)
*H01J 37/317* (2006.01)

(52) U.S. Cl.
CPC ........ *H01J 37/3045* (2013.01); *H01J 37/304* (2013.01); *H01J 37/3007* (2013.01); *H01J 37/3171* (2013.01); *H01J 2237/24405* (2013.01); *H01J 2237/24514* (2013.01); *H01J 2237/24528* (2013.01); *H01J 2237/24535* (2013.01)

(58) Field of Classification Search
CPC . H01J 37/3045; H01J 37/3171; H01J 37/3007
USPC ......... 250/396 R, 397, 492.1, 492.2, 492.21, 250/492.22, 492.23, 492.3
See application file for complete search history.

(56) References Cited

U.S. PATENT DOCUMENTS

| | | | |
|---|---|---|---|
| 5,091,645 A | 2/1992 | Elliott | |
| 5,481,116 A | 1/1996 | Glavish et al. | |
| 5,780,863 A | 7/1998 | Benveniste et al. | |
| 6,111,260 A | 8/2000 | Dawson et al. | |
| 6,231,054 B1 | 5/2001 | Allen, Jr. et al. | |

(Continued)

OTHER PUBLICATIONS

Notice of Allowance dated Apr. 29, 2011 in connection with U.S. Appl. No. 12/108,890.

(Continued)

*Primary Examiner* — Nicole Ippolito
(74) *Attorney, Agent, or Firm* — Eschweiler & Potashnik, LLC (57) ABSTRACT

A method for improving the productivity of a hybrid scan implanter by determining an optimum scan width is provided. A method of tuning a scanned ion beam is provided, where a desired beam current is determined to implant a workpiece with desired properties. The scanned beam is tuned utilizing a setup Faraday cup. A scan width is adjusted to obtain an optimal scan width using setup Faraday time signals. Optics are tuned for a desired flux value corresponding to a desired dosage. Uniformity of a flux distribution is controlled when the desired flux value is obtained. An angular distribution of the ion beam is further measured.

14 Claims, 6 Drawing Sheets

(56) References Cited

U.S. PATENT DOCUMENTS

| | | | |
|---|---|---|---|
| 6,437,350 | B1 | 8/2002 | Olson et al. |
| 6,441,382 | B1 | 8/2002 | Huang |
| 6,635,880 | B1 | 10/2003 | Renau |
| 6,710,358 | B1 | 3/2004 | Chen et al. |
| 6,777,695 | B2 | 8/2004 | Viviani |
| 6,777,696 | B1 | 8/2004 | Rathmell et al. |
| 6,946,667 | B2 | 9/2005 | Chen et al. |
| 6,998,625 | B1 | 2/2006 | McKenna et al. |
| 7,135,691 | B2 | 11/2006 | Vanderpot et al. |
| 7,351,987 | B2 | 4/2008 | Kabasawa et al. |
| 7,994,488 | B2 | 8/2011 | Huang |
| 2002/0066872 | A1 | 6/2002 | Nishihashi et al. |
| 2003/0066976 | A1 | 4/2003 | Chen et al. |
| 2004/0227074 | A1 | 11/2004 | Benveniste et al. |
| 2005/0230643 | A1 | 10/2005 | Vanderpot et al. |
| 2006/0057303 | A1* | 3/2006 | Agarwal ............... H01J 37/304 427/523 |
| 2006/0097193 | A1 | 5/2006 | Horsky et al. |
| 2006/0145095 | A1 | 7/2006 | Olson et al. |
| 2006/0219955 | A1 | 10/2006 | Ray |
| 2006/0284117 | A1 | 12/2006 | Vanderpot et al. |
| 2007/0114455 | A1 | 5/2007 | Naito et al. |
| 2008/0258074 | A1 | 10/2008 | Tsukihara et al. |
| 2009/0261248 | A1 | 10/2009 | Glavish et al. |
| 2014/0053778 | A1* | 2/2014 | Naito ................. H01J 37/3171 118/720 |

OTHER PUBLICATIONS

Office Action dated Jan. 14, 2011 in connection with U.S. Appl. No. 12/108,890.

\* cited by examiner

SYSTEM AND METHOD TO IMPROVE PRODUCTIVITY OF HYBRID SCAN ION BEAM IMPLANTERS

REFERENCE TO RELATED APPLICATION

This application claims priority to and the benefit of U.S. Provisional Application Ser. No. 62/096,976 which was filed Dec. 26, 2014, entitled "SYSTEM AND METHOD TO IMPROVE PRODUCTIVITY OF HYBRID SCAN ION BEAM IMPLANTERS", the entirety of which is hereby incorporated by reference as if fully set forth herein.

FIELD

The present disclosure relates generally to semiconductor processing systems, and more specifically to a system and method for providing an improved ion beam setup time and an optimum scan width during ion implantation.

BACKGROUND

In the semiconductor industry, various manufacturing processes are typically carried out on a workpiece (e.g., a semiconductor substrate) in order to achieve various results on the workpiece. Processes such as ion implantation, for example, are performed in order to obtain a particular characteristic within the workpiece, such as a specific bulk resistivity or a limited diffusivity of a dielectric layer on the workpiece by implanting a specific type of ion.

In a typical serial implantation process, a single workpiece is implanted at a time by an ion beam, which could be a pencil ion beam or spot ion beam generally scanned back and forth with respect to the workpiece or a broad ribbon beam, therein facilitating implanting or doping all of the workpiece with ions. In a mechanically scanned implantation system, the workpiece is mechanically scanned through a stationary ion beam in a fast scan direction while stepping with slower velocity in a transverse direction with respect to the ion beam, e.g. in a slow scan direction, therein effectively implanting a portion or "strip" of the workpiece each time it passes through the ion beam in the fast scan direction.

In what is called a "hybrid" scan ion beam implantation system, the ion beam is scanned (e.g., using an electric scanner) in the fast scan direction along one axis, therein defining a scanned ribbon beam having a given length (often called a scan width). Accordingly, the workpiece is typically mechanically scanned through the scanned ribbon beam in the slow scan direction that is generally orthogonal to the ribbon beam, therein uniformly distributing the beam over the workpiece. The scanned ion beam effectively implants a portion or "strip" of the workpiece each time it passes across the workpiece in the fast scan direction, wherein a length of the scanned path of the ion beam typically exceeds the diameter of the workpiece (commonly called "overshoot" or "overscan") in order to uniformly dope the workpiece with ions.

Throughput of workpieces through the ion implantation system is commonly a function of the ion beam utilization, which is defined by the amount of dopant implanted to the workpiece versus the total amount of dopant output by the ion beam over a given time period. Attempts have been made to maximize the ion beam utilization of hybrid scan ion implanters by determining an optimum scan width of the ribbon beam. One difficulty, however, is that the scan width of the ribbon beam is typically fixed for a given ion implanter, whereby the scan width has to be wide enough to implant a workpiece of maximum size (along with the proper amount of overscan) in order to provide a uniform implantation. Since many workpieces have diameters that are less than the diameter of the maximum-sized workpiece, (e.g., a generally circular workpiece), maintaining such long scan widths for workpieces that are smaller than the maximum-sized workpiece can often result in poor ion beam utilization.

Furthermore, the ion beam is conventionally profiled during implant setup, wherein a size of the ion beam and the optimal scan width is determined such that the fixed scan width ensures an adequate implant and overshoot across the entire workpiece in order to provide acceptable implant uniformity. Such profiling, however, typically includes one or more diagnostic and/or calculation procedures, therein adding time to the implant setup. The additional time taken for profiling the ion beam during implant setup often counteracts or negates the reduction in implant time achieved by optimizing the scan width, thus, adversely affecting workpiece throughput.

SUMMARY

The present invention overcomes limitations of the prior art by providing an efficient system and method to determine an optimal scan width of a ribbon beam with minimal impact on setup time and improved process performance and productivity. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward system and method that improves productivity of a hybrid scan ion beam implanter. The workpiece is moved in one direction through a scanned ion pencil beam in a controlled manner to mitigate "overshoot". The workpiece moves in the first direction which is orthogonal to the width of the scanned beam. More particularly, the ion pencil beam is scanned along a fast scan path and remains stationary with respect to a substantially perpendicular slow scan path that the workpiece moves along to produce a scan pattern on the workpiece that approximates the size and/or shape of the workpiece. As such, the implantation process is performed in an efficient manner. The relative movement of the workpiece to the ion beam can be further controlled to develop one or more additional scan patterns on the workpiece that are interleaved among existing scan patterns. This facilitates uniformly implanting the entirety of the workpiece with ions.

According to another exemplary aspect of the invention, a system is provided to determine an optimum scan width in a hybrid scan implanter. The system comprises an ion source configured to extract a pencil ion beam, a mass resolving apparatus, and an ion beam scanning system. The ion beam scanning system is configured to scan the ion in a fast scan direction to yield a so-called ribbon beam. A workpiece is mounted on a transport mechanism wherein the transport mechanism is configured to sweep the workpiece through the ribbon beam orthogonal to a length of the ribbon beam. A control system is further provided for controlling the ion implantation system, wherein a dosimetry system measures and stores a beam current signal associated with the ion beam.

In accordance with another exemplary aspect of the present invention, a method is provided to improve the productivity of a hybrid scan ion beam implanter. The method comprises extracting an ion beam from an ion source and directing the ion beam to a mass resolving system, thereby mass resolving the ion beam. The method further comprises scanning the ion beam to define a ribbon ion beam. The ribbon ion beam is further directed to a workpiece via an optics system for implantation therein.

According to yet another exemplary aspect, a method for tuning a scanned ion beam determines a beam current to implant a workpiece with desired properties. The method comprises tuning the scanned beam utilizing a setup Faraday and adjusting a scan width to obtain an optimal scan using time signals from the setup Faraday. The method further comprises tuning the optics for a desired flux value corresponding to a desired dosage of the implant, and further controlling uniformity of the flux distribution when the desired flux value is obtained. In one example, the method further comprises measuring and controlling an angular distribution of the ion beam.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

The present invention is directed generally toward system and method that improves productivity of a hybrid scan ion beam implanter. The workpiece is moved in a first direction through a scanned ion beam (e.g., a pencil or spot ion beam) in a controlled manner to mitigate "overshoot". The workpiece moves in the first direction which is orthogonal to the width of the scanned beam. More particularly, the ion beam is scanned along a fast scan path and remains stationary with respect to a substantially perpendicular slow scan path that the workpiece moves along to produce a scan pattern on the workpiece that approximates the size and/or shape of the workpiece.

Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 1:
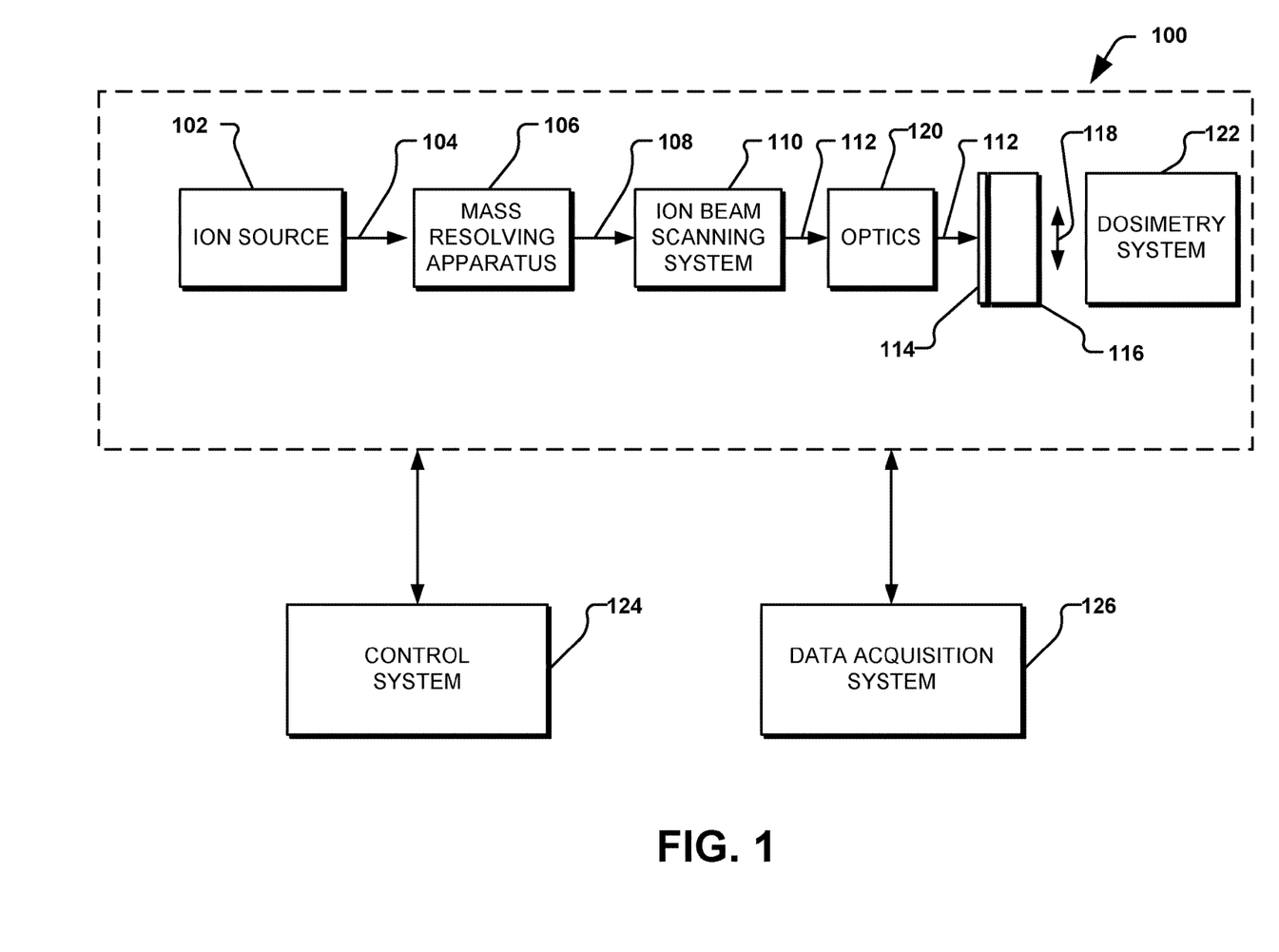
FIG. 1 is a schematic illustration of a system to improve productivity of a hybrid scan ion beam implanter according to an exemplary aspect of the invention.

Referring now to the figures, FIG. 1 illustrates an exemplary hybrid scan ion beam implantation system 100 in accordance with various aspects of the disclosure. The hybrid scan ion beam implantation system 100, for example, comprises an ion source 102, wherein an extraction assembly (not shown) is configured to extract charged ions from the ion source via application of an extraction voltage to the extraction assembly. For an n-type implantation, for example, the source materials provided within the ion source 102 may comprise boron, gallium or indium. For a p-type implantation, the source materials may comprise arsenic, phosphorus, antimony, and the like. The ion beam 104 (e.g., a pencil or spot ion beam) enters a mass resolving apparatus 106 downstream of the ion source 102, thus defining a mass analyzed ion beam 108. The mass analyzed ion beam 108 then enters an ion beam scanning system 110, wherein the ion beam scanning system is configured to scan the mass analyzed ion beam 108 to define a so-called ribbon beam 112 having a beam width (e.g., the beam width goes into the paper). A workpiece 114 is mounted on a transport mechanism 116, wherein the transport mechanism is configured to translate the workpiece 114 in a first direction 118 through the ribbon beam 112. The first direction 118, for example, is orthogonal to the beam width of the ribbon beam 112.

In accordance with one exemplary aspect, an optics system 120 is provided to control focusing and positioning of the ribbon beam 112. Components of the optics system 120, for example, can be positioned anywhere along the path of the ion beam 104, 108, 112 to control parameters of the ion beam, such as focusing, parallelism, and the like. In one example, the optics system 120 comprises ion beam focusing and steering components, such as ion lenses (e.g., dipole, quadrupole or higher order lenses) and prisms (e.g., dipole magnets, Wien filters), either of which can be magnetic, electric or using a combination of both.

According to another example, a dosimetry system 122 is further provided and configured to measure a beam current signal associated with the ribbon beam 112. A control system 124 is further provided to control various aspects of the hybrid scan ion beam implantation 100. A data acquisition system 126, for example, is configured to retrieve, store, and/or analyze data associated with the operation of the hybrid scan ion beam implantation system 100 and to provide said data to the controller 124. For example, the data acquisition system 126 is configured to retrieve data such as beam current data from the dosimetry system 122, position data from the transport mechanism 116, beam position data from the ion beam scanning system 110, and the like, and provide said data to the controller 124. The controller 124, for example, may also serve as the data acquisition system 126.

Figure 2A:
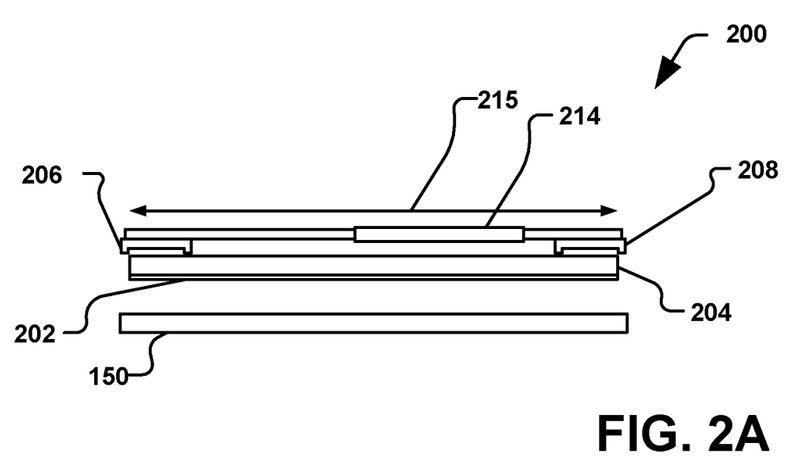
FIG. 2A is a view along a workpiece plane of a hybrid scan ion beam implanter and dosimetry system according to another exemplary aspect of the invention.

In the event that it is desired to scan the ribbon beam 112 across additional components of the dosimetry system 122, such as a setup Faraday 150 (also called a tuning Faraday) illustrated in FIG. 2A, whereby the desired scan width is larger than the width of the workpiece 114, the width of the setup Faraday may be increased to a desired scan width, or a predetermined or known additional scan width can be added to the optimum scan width. A width 152 of the setup Faraday 150 in the direction of the ribbon beam 112, for example, is finite and representative of the scan width desired (e.g., similar to the width of the workpiece 114).

Figure 2B:
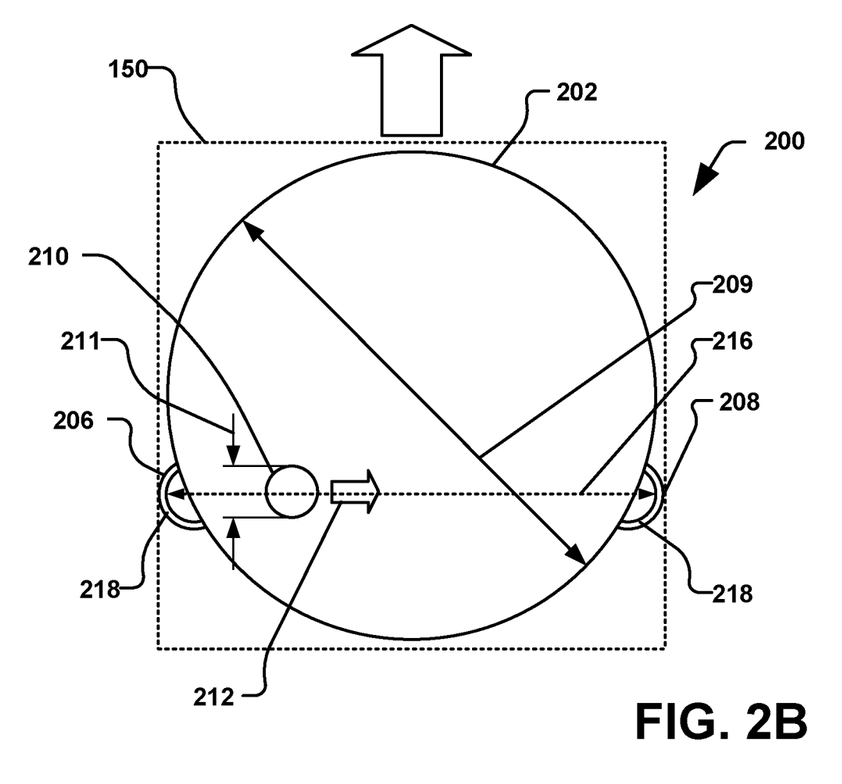
FIG. 2B is a view orthogonal to the workpiece plane of a hybrid scan ion beam implanter dosimetry system according to yet another exemplary aspect of the invention.

FIGS. 2A and 2B illustrate an exemplary dosimetry system 200, wherein a workpiece 202 is mounted to a transport system 204 positioned within an end station of a hybrid scan ion beam implantation system, such as the hybrid scan ion beam implantation system 100 of FIG. 1. The dosimetry system 200 of FIGS. 2A and 2B, for example, comprises the setup Faraday 150, a first Faraday cup 206 and a second Faraday cup 208 (also called "dose cups") separated by a distance approximately equal to a diameter 209 of the workpiece 202. A ribbon beam 210 having a ribbon beam height 211 (e.g., a diameter of the ion beam 108 of FIG. 1) is swept to the right in the present example as illustrated by arrow 212, wherein the first and second Faraday cups 206 and 208 have an opening height approximately equal to at least the height (e.g., the maximum height) of the ribbon beam.

The dosimetry system 200 is configured with a mechanism 214 operable to control a distance 215 between the first and second Faraday cups 206, 208 as desired, wherein the dosimetry system is configured to accommodate workpieces 202 of varying diameter 209. The mechanism 214, for example, comprises a line drive, rack and pinion, or any other drive system operable to control the distance 215 between the first and second Faraday cups 206, 208 of the dosimetry system 200. The various workpieces 202 can comprise widths of 150, 200, 300 and 450 mm, for example, thus making the distance 215 between the first and second Faraday cups 206, 208 of the dosimetry system 200 likewise variable. It should be noted that although the dosimetry system 200 is described herein as comprising two Faraday cups 206, 208, the dosimetry system can alternatively comprise any beam current measuring device positioned as described above, and all such alternatives are contemplated as falling within the scope of the present disclosure.

The distance 215 between the first and second Faraday cups 206, 208, for example, is configured to be varied via the mechanism 214 in order to limit a scan width 216 of the ribbon beam 210 (e.g., the width of the scan of the spot ion beam across the workpiece), whereby beam current sensed by the tuning Faraday 150 is reduced when the ion beam (e.g., the scanned spot ion beam 108 of FIG. 1) passes over the first and second Faraday cups. Each of the two Faraday cups 206, 208, for example, comprises a respective aperture 218 associated therewith, as illustrated in FIG. 2B, and wherein the mechanism 214 is configured to vary a collection area of the dosimetry system 200 and to occlude the respective aperture, thus restricting a width of the ribbon ion beam 210 being measured. The aperture 218 may be integral to, or separate from, the respective Faraday cups 206, 208. When the beam current sensed by the tuning Faraday 150 is approximately zero (e.g., when all of the ion beam 210 is on the respective first or second Faraday cup 206, 208), the scan width 216 is considered to be optimized.

Figure 3:
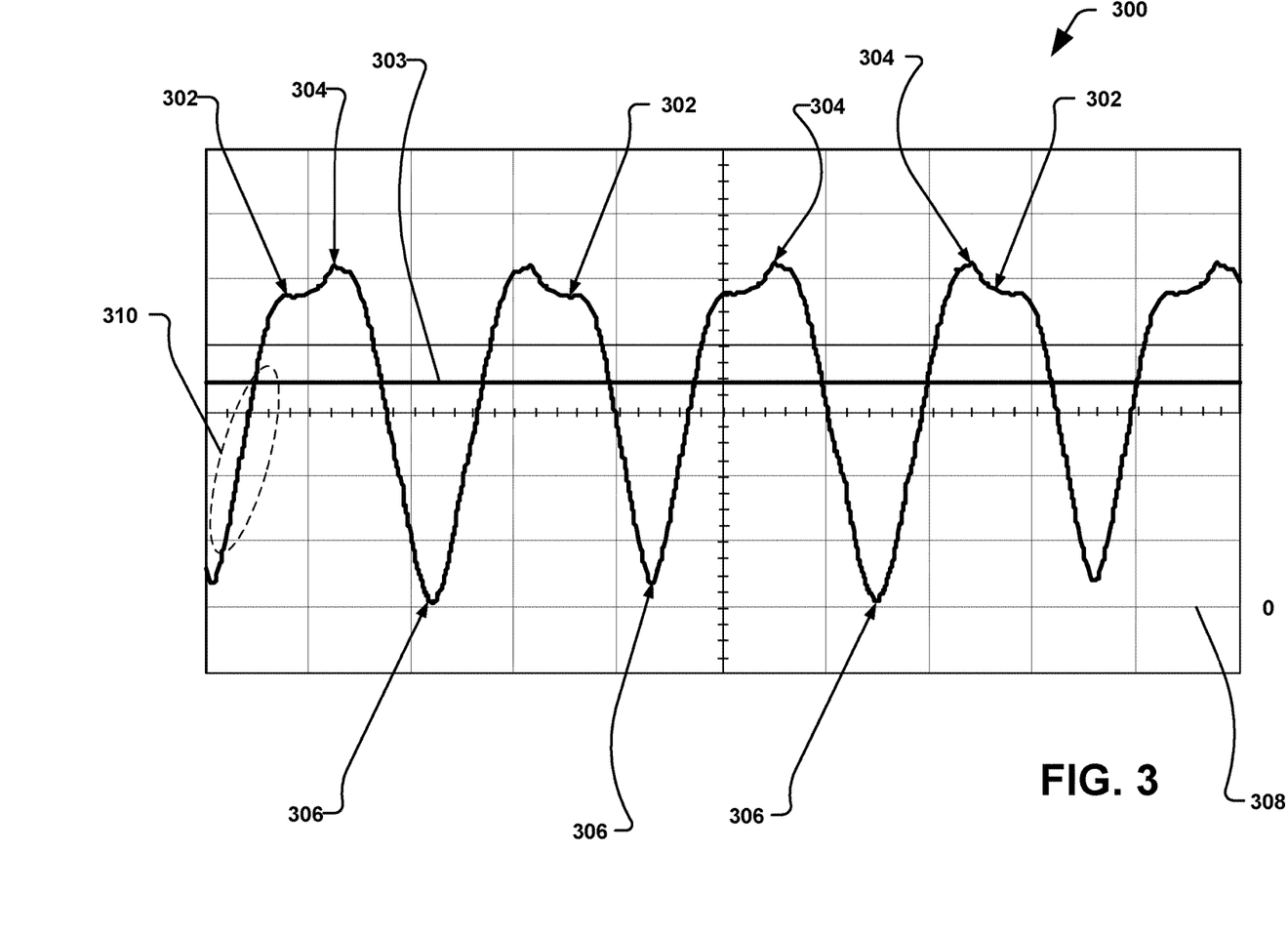
FIG. 3 is a graph illustrating beam current measurement according to another exemplary aspect of the invention.
Figure 4:
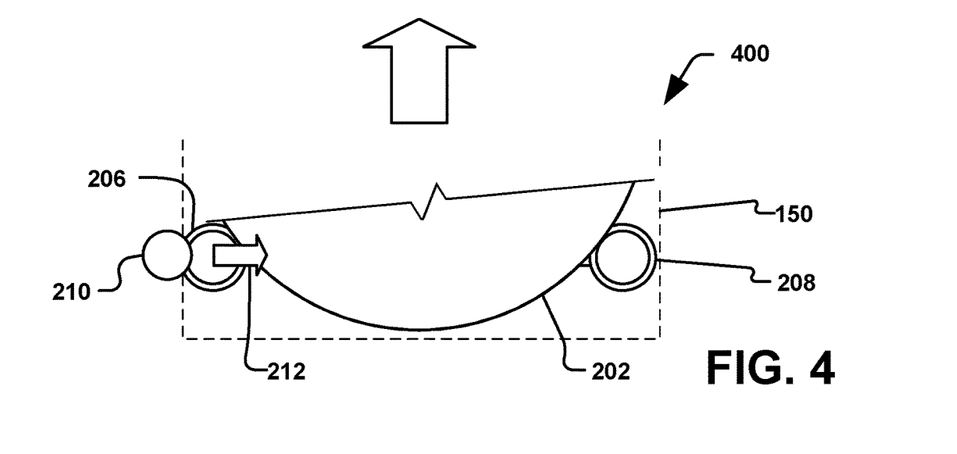
FIGS. 4-6 are respective views orthogonal to the workpiece plane of a portion of the workpiece and a dosimetry system at various positions of an ion beam with respect to the workpiece in accordance with yet another exemplary aspect of the invention.
Figure 5:
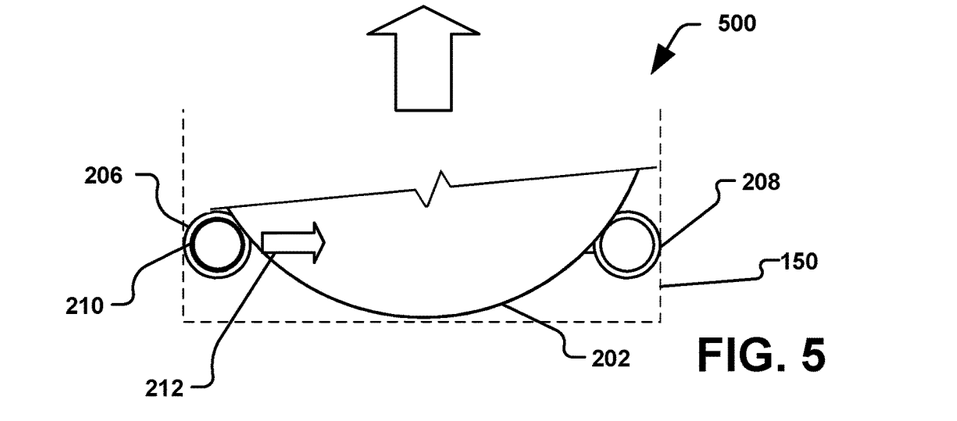
Figure 6:
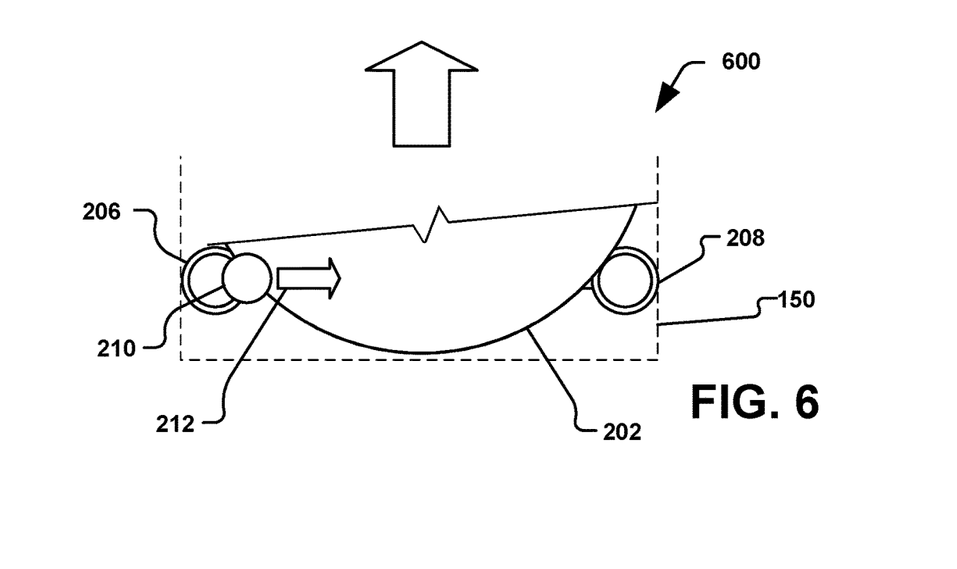

Referring to FIG. 3 a graph 300 illustrates various waveforms collected by the first Faraday cup 206 of dosimetry system 400 illustrated in FIG. 4. A first waveform 302 shows the time-dependence of the measured Faraday current of the first Faraday cup 206, for example. As illustrated in FIG. 4, the ribbon beam 210 is scanned to the right as indicated by arrow 212. The Faraday current measured by the first Faraday cup 206 is somewhere within the dashed area 310 coincident with the first waveform 302. The Faraday current of the dosimetry system 500 of FIG. 5 reaches an approximate maximum 304 shown in FIG. 3 when an entire ribbon beam 210 is collected by the first Faraday cup 206, as illustrated, or by the second Faraday cup 208. As the ribbon beam 210 is scanned off the first Faraday cup 206 as illustrated in FIG. 6, for example, the current is reduced to a lower level on the downward slope and reaches a value 306 shown in FIG. 3 that is close to or near the zero line 308.

It is to be appreciated that during a scan period, the Faraday current of the ribbon beam 210 goes to approximately zero twice (e.g., while the ribbon beam is scanned off of the Faraday cup 206 or 208, in either direction). The present example illustrates a situation when the scan width across the workpiece 202 is large relative to a long time period during which current from the ribbon beam 210 is collected by the dosimetry system 200. However, for short scan widths or scan widths that are less than the distance 215 between the first and second Faraday cups 206, 208 of the dosimetry system 200, the current collected by the dosimetry system may not drop to zero 308.

Figure 7:
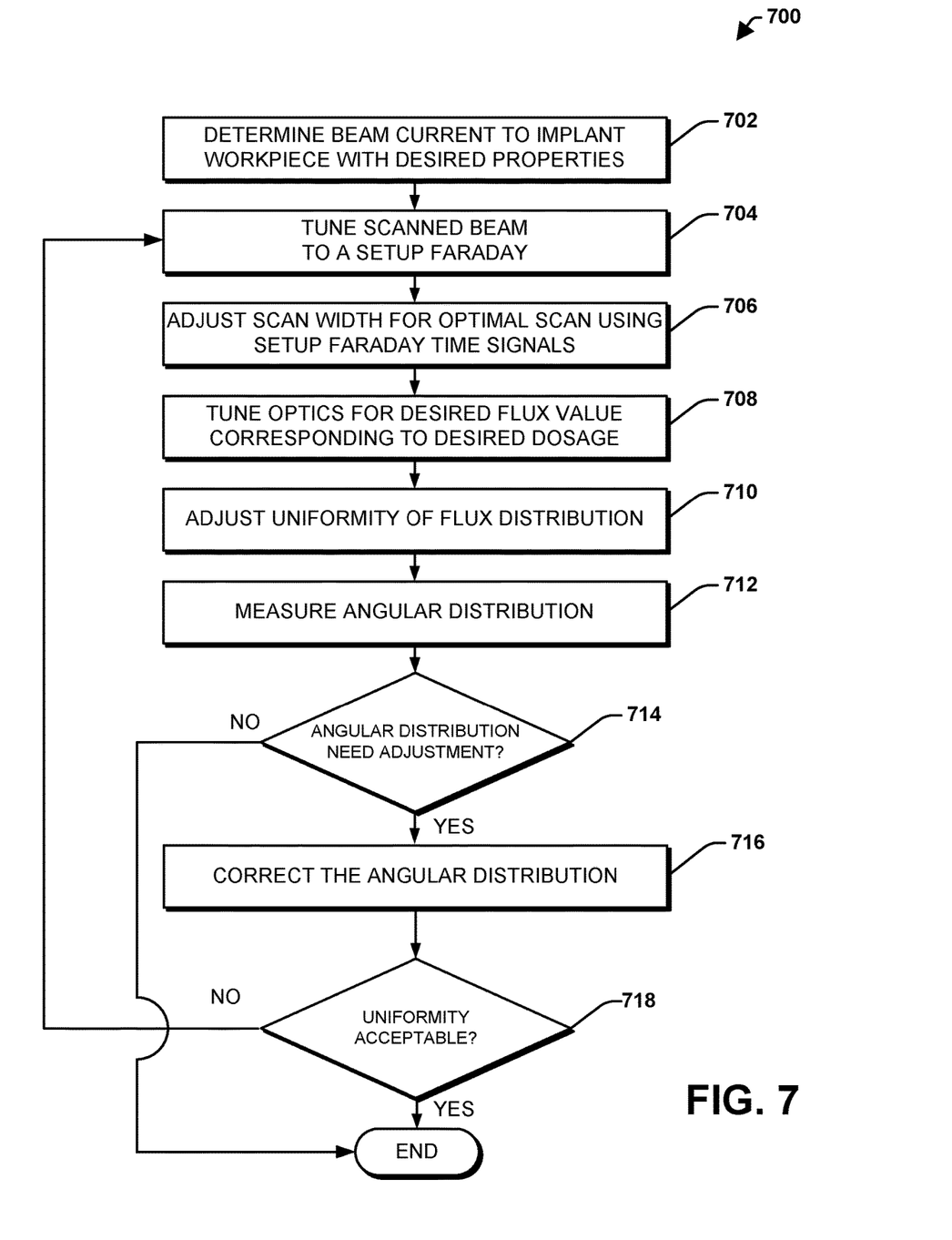
FIG. 7 is a flow diagram of a method for improving the productivity of a hybrid scan implanter by determining an optimum scan width in accordance with another aspect of the present invention.

FIG. 7 illustrates a method 700 for tuning an ion beam to improve productivity of hybrid scan ion beam implanters in accordance with another exemplary aspect of the present invention, whereby reference to FIGS. 1, 2A-2B and 3-6 are made. The method 700 can be performed to obtain the above-described characteristics and, optionally, to perform adjustments on ion beam generation and/or beam processing in accordance with said characteristics. For example, the method 700 can be performed as part of a setup process and/or during ion implantation.

The method 700 begins at act 702, wherein the necessary ion beam current is determined in order to implant a workpiece with the desired properties according to one or more desired characteristics or parameters. For example, the desired properties can include an optimum scan, a desired beam current intensity, desired flux values, uniform flux, and angular distribution, among others. At act 704, tuning of the scanned beam 210 is performed with respect to a dosimetry system, such as the dosimetry system 200 of FIGS. 2A-2B. At act 706, the scan width is adjusted for an optimal scan and at act 708 the optics are tuned for a desired flux value corresponding to a desired dosage.

In one example, act 706 comprises setting the scan width to the optimal scan by integrating the current (e.g., the "pulse" current, whereby the current goes to zero on both sides of the "pulse"), and a desired current limit is selected (e.g., "approximately zero" current ranging from 0%-5% of current in the Faraday cup) for a given width of the Faraday cup. For example, selecting a non-zero current limit can be advantageous to leave some current on the Faraday cup, as overscanning the workpiece may be beneficial, whereby a smaller scan width provides higher utilization. It should be further noted that the optics can be tuned in real time based, at least in part, on the measured parameters, as discussed above.

The real-time adjustment of the scan width can be accomplished where the implanter optics are tuned while the beam scanning system is operating, such as to maximize the scanned beam current. In this case, a closed-loop control sub-system of a machine control system, for example, adjusts the scan width to the optimum value faster than beam tuning changes are made to properties (e.g., width) of the pencil beam. An exemplary implementation of this method involves maximizing the utilization of the scanned beam by tuning the implanter optics to increase the time period during which the setup Faraday signal reaches zero (e.g., during overscan), and successively reducing the scan width, while maintaining or increasing scanned beam current on the setup Faraday. Tuning ends when a desired or optimum scanned beam current has been obtained.

In one example, the uniformity of the flux distribution can be adjusted at act 710 once the desired flux value is obtained at act 708. When the desired flux value uniformity has been obtained the flux distribution is adjusted at act 710, the angular distribution is further measured at act 712. If the angular distribution is determined to be correct or acceptable at act 714 then the tuning can be considered complete. If it is determined that the angular distribution needs adjustment at act 714, wherein the angular distribution is corrected at act 716. At act 718 a determination is made whether the uniformity is acceptable. If the uniformity is acceptable at act 718, the tuning can be considered complete; otherwise the method 700 returns to 704 in an iterative manner.

The sequence described in the exemplary method 700 achieves the tuning of an optimally over-scanned ribbon beam with desired properties. These desired properties are obtained without knowledge of the properties of the unscanned beam 108 of FIG. 1. By not having to diagnose the unscanned beam 108, for example, tuning time is saved and the productivity of the implanter 100 is enhanced. It may, however, be desirable to determine the properties of the unscanned beam 108, as well as the scanned ribbon beam 112.

Figure 8:
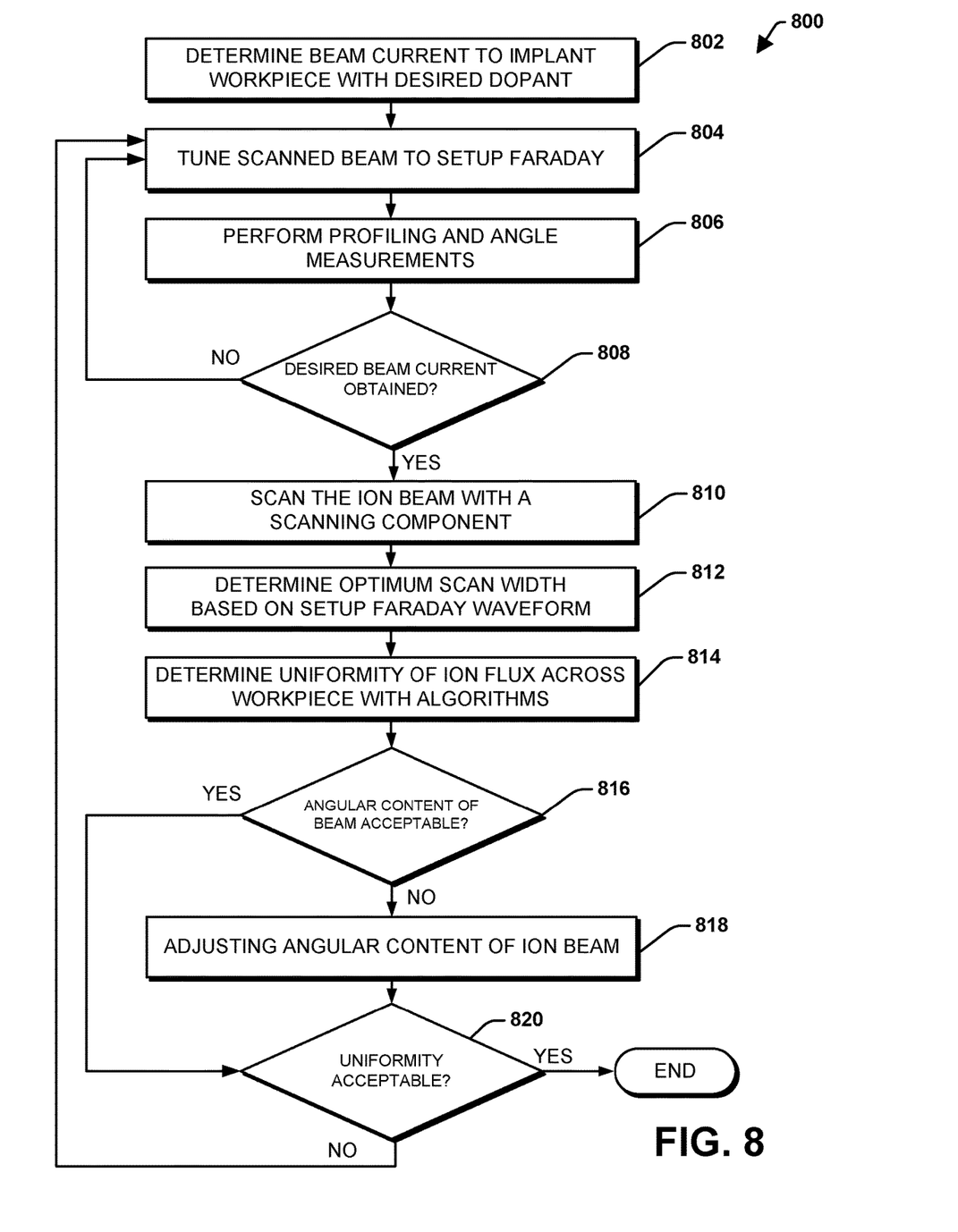
FIG. 8 is another flow diagram of a method of determining an optimum scan width for a hybrid scan implanter in accordance with yet another aspect of the present invention.

If this is the case, then a typical tuning sequence starts as illustrated in FIG. 8 with determining the beam current necessary to implant a workpiece with a desired dosage of dopant at act 802. The operator and/or the control system at act 804 tunes the unscanned beam current to the setup Faraday (e.g., the dosimetry system), and perform profiling and angle measurements at act 806. If the desired beam current is not obtained at act 808 the method 800 returns to act 804. Otherwise, the scanning component scans the ion beam and the setup Faraday waveform is used at act 812 to quickly determine an optimum scan width. Subsequently, the uniformity of the ion flux across the workpiece at act 814 is obtained. The angular content of the ion beam is measured at act 816 and, if necessary, adjusted at act 818. If the angle of the scanned beam needs adjustment at act 820, the scan width is again set to a new optimum value at act 804, and the uniformity of the scanned beam is again adjusted at to a desired value, in an iterative correction scheme.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system for optimizing a scan width on a workpiece, comprising:
   an ion source;
   an extraction aperture configured to extract a spot ion beam from the ion source;
   a mass resolving apparatus positioned downstream of the extraction aperture, wherein the mass resolving apparatus is configured to mass analyze the spot ion beam;
   an ion beam scanning apparatus positioned along a path of the spot ion beam, wherein the ion beam scanning apparatus is configured to reciprocally scan the spot ion beam in a fast scan direction, therein defining a ribbon ion beam having a ribbon beam width;
   a workpiece scanning apparatus having a workpiece mount configured to selectively secure the workpiece, wherein the workpiece scanning apparatus is configured for translate the workpiece through the ribbon ion beam;
   a dosimetry system positioned downstream of the workpiece mount, wherein the dosimetry system comprises a tuning Faraday configured to measure a beam current of the ribbon ion beam; and
   a control system configured for tuning the ion beam to optimize the scan width based, at least in part, on the beam current measured by the dosimetry system.

2. The system of claim 1, wherein the control system is configured to tune the control one or more of a size, current, and angle of the ribbon ion beam in real-time to optimize the scan width of the ion beam.

3. The system of claim 1, wherein the controller is configured to collect the beam current with a technique comprising one or more of current-to-voltage conversion, isolation, averaging and filtering techniques.

4. The system of claim 1, wherein the dosimetry system comprises two Faraday cups separated by a distance associated with a diameter of the workpiece, wherein the two Faraday cups have an opening with a height equal to at least a maximum height of the ribbon ion beam.

5. The system of claim 4, wherein the dosimetry system comprises a mechanism configured to vary the distance between the two Faraday cups and is configured to accommodate varying diameters of the workpiece.

6. The system of claim 5, wherein the varying diameters range from 150 mm to 450 mm.

7. The system of claim 5, wherein each of the two Faraday cups comprises a respective aperture associated therewith, and wherein the mechanism is configured to vary a collection area of the dosimetry system and to occlude the respective aperture, thus restricting a width of the ribbon ion beam being measured.

8. The system of claim 1, wherein the control system is configured to acquire at least one half of a scan period of the spot ion beam scanned in the fast scan direction with resolution and accuracy to capture beam current changes occurring while the spot ion beam is scanned across the dosimetry system.

9. The system of claim 1, wherein the tuning Faraday has a finite width associated therewith, wherein the control system is configured to tune the ion beam to optimize the scan width based, at least in part, on the beam current measured by the tuning Faraday.

10. A method to improve productivity of a hybrid scan ion beam implanter, the method comprising:
    extracting an spot ion beam from an ion source and directing the spot ion beam to a mass analyzer;
    analyzing the spot ion beam via the mass analyzer;
    scanning the spot ion beam in a fast scan direction, therein defining a ribbon ion beam;
    translating a workpiece through the ribbon ion beam transverse to a width of the ribbon ion beam;
    measuring beam current signals of the ribbon ion beam utilizing a dosimetry system comprising two Faraday cups separated by a width;
    varying a collection area of the dosimetry system via an occluding aperture, thereby restricting a width of the ribbon ion beam being measured;
    providing the beam current signals of the ribbon ion beam associated with the varied collection area to a control system; and
    optimizing the width of the ribbon ion beam via the control system based, at least in part, on the beam current signals.

11. The method of claim 10, wherein a transport system translates the workpiece through the ribbon ion beam in a direction that is orthogonal to the width of the ribbon ion beam.

12. The method of claim 10, wherein varying the collection area of the dosimetry system comprises varying a width between two Faraday cups of the dosimetry system to accommodate various diameter workpieces.

13. The method of claim 10, wherein varying the collection area of the dosimetry system is based, at least in part, on a variation in diameter of the workpiece ranging from 150 mm to 450 mm.

14. A method of tuning a scanned beam, comprising:
    determining a desired beam current to implant a workpiece with desired properties;
    tuning the scanned beam utilizing a setup Faraday cup;
    adjusting a scan width to obtain an optimal scan width using setup Faraday time signals;
    tuning optics for a desired flux value corresponding to a desired dosage;
    adjusting uniformity of flux distribution when the desired flux value is obtained;
    measuring an angular distribution;
    determining whether the angular distribution is acceptable or unacceptable; and
    adjusting the angular distribution when the angular distribution is determined to be unacceptable.

* * * * *